United States Patent
Han

(10) Patent No.: US 9,066,386 B2
(45) Date of Patent: Jun. 23, 2015

(54) ORGANIC LIGHT EMITTING DISPLAY APPARATUS AND METHOD OF MANUFACTURING THE SAME

(71) Applicant: Samsung Display Co., Ltd., Yongin, Gyeonggi-do (KR)

(72) Inventor: Byung-Uk Han, Yongin (KR)

(73) Assignee: Samsung Display Co., Ltd. (KR)

( * ) Notice: Subject to any disclaimer, the term of this patent is extended or adjusted under 35 U.S.C. 154(b) by 7 days.

(21) Appl. No.: 14/014,038

(22) Filed: Aug. 29, 2013

(65) Prior Publication Data
US 2014/0319998 A1    Oct. 30, 2014

(30) Foreign Application Priority Data

Apr. 29, 2013  (KR) .......................... 10-2013-0047195

(51) Int. Cl.
*H05B 33/04* (2006.01)
*H01L 51/52* (2006.01)

(52) U.S. Cl.
CPC ............ *H05B 33/04* (2013.01); *H01L 51/5237* (2013.01); *H01L 51/5246* (2013.01)

(58) Field of Classification Search
CPC . H01L 51/5237; H01L 51/5246; H05B 33/04
USPC ........................................................ 313/504
See application file for complete search history.

(56) References Cited

U.S. PATENT DOCUMENTS

| | | | |
|---|---|---|---|
| 6,368,730 B1 * | 4/2002 | Kishimoto et al. ........... | 428/690 |
| 6,717,052 B2 * | 4/2004 | Wang et al. .................. | 174/381 |
| 7,193,366 B2 * | 3/2007 | Tomimatsu et al. .......... | 313/512 |
| 2002/0011783 A1 * | 1/2002 | Hosokawa ..................... | 313/504 |
| 2004/0150319 A1 * | 8/2004 | Tomimatsu et al. .......... | 313/495 |
| 2005/0275342 A1 | 12/2005 | Yanagawa | |
| 2006/0055318 A1 | 3/2006 | Baik et al. | |
| 2006/0082299 A1 * | 4/2006 | Yang ............................. | 313/512 |
| 2006/0284556 A1 * | 12/2006 | Tremel et al. ................. | 313/512 |
| 2008/0297042 A1 * | 12/2008 | Ahn et al. ..................... | 313/504 |
| 2009/0215279 A1 * | 8/2009 | Kim et al. ..................... | 438/763 |
| 2014/0268298 A1 * | 9/2014 | Hendriks et al. ............. | 359/290 |

FOREIGN PATENT DOCUMENTS

| | | |
|---|---|---|
| KR | 10-2006-0025242 | 3/2006 |
| KR | 10-2006-0025243 | 3/2006 |
| KR | 10-2006-0031590 | 4/2006 |

* cited by examiner

*Primary Examiner* — Thomas A Hollweg
(74) *Attorney, Agent, or Firm* — Knobbe Martens Olson & Bear LLP

(57) ABSTRACT

An organic light emitting display apparatus includes a first substrate, an organic light emitting element, a second substrate and a sealing complex. The first substrate includes a display region and at least one peripheral region. The at least one peripheral region surrounds the display region. The organic light emitting element is disposed in the display region. The second substrate corresponds to the first substrate. The sealing complex includes a first seal and a second seal. The first seal is disposed between the at least one peripheral region of the first substrate and the second substrate. The first seal surrounds the display region. The second seal is spaced apart from the first seal by a hydrophobically treated surface. The second seal surrounds the first seal.

11 Claims, 8 Drawing Sheets

ORGANIC LIGHT EMITTING DISPLAY APPARATUS AND METHOD OF MANUFACTURING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority under 35 U.S.C. §119 to Korean Patent Application No. 10-2013-0047195 filed on Apr. 29, 2013, the disclosure of which is hereby incorporated by reference herein in its entirety.

BACKGROUND

1. Field

This disclosure relates to an organic light emitting display apparatus having a complex combining structure of organic and inorganic materials and a method of manufacturing the organic light emitting display apparatus.

2. Description of the Related Technology

An organic light emitting device has its own emission characteristics, and typically does not require a light source as does a liquid crystal display (LCD) device. Thus, the organic light emitting device can have reduced thickness and weight. In addition, the organic light emitting device includes high-quality features such as low power consumption, high-luminance and high reaction rate.

In general, the organic light-emitting display device includes a substrate, an organic light emitting diode and sealant and other components. When water and oxygen from an outer environment flow into the device, the organic light-emitting display device experiences problems such as oxidation of the electrode materials, decrease of the life of the device, decrease of the luminous efficiency and deterioration of luminous color.

In manufacturing of the organic light-emitting display device, to protect the device from the water or oxygen of an outer environment, a sealing process is generally performed. For example, to protect the organic light emitting diode, the organic light-emitting display device is sealed by the substrate and the sealant.

But, because of pollution of the sealant, the protective feature of sealing is reduced.

SUMMARY OF CERTAIN INVENTIVE ASPECTS

Example embodiments provide an organic light emitting display apparatus having a sealing complex having improved sealing characteristics.

Example embodiments provide a method of manufacturing the above-mentioned organic light emitting display apparatus.

According to one aspect of example embodiments, an organic light emitting display apparatus includes a first substrate, an organic light emitting element, a second substrate and a sealing complex. The first substrate includes a display region and at least one peripheral region. The at least one peripheral region surrounds the display region. The organic light emitting element is disposed in the display region of the first substrate. The second substrate corresponds to the first substrate. The sealing complex includes a first seal and a second seal. The first seal is disposed in the at least one peripheral region. The first seal surrounds the display region. The second seal is spaced apart from the first seal by a hydrophobic treated surface. The second seal surrounds the first seal.

In example embodiments, the hydrophobic treated surface may include a surface between the first and second seals and an upper surface of the first substrate.

In example embodiments, the hydrophobic treated surface may further include a lower surface of the second substrate.

In example embodiments, the first seal may include an organic material.

In example embodiments, the second seal may include an inorganic material.

In example embodiments, the hydrophobic treated surface may be formed by a low temperature plasma treatment.

In example embodiments, the sealing complex may further include a hydrophilic treated surface.

In example embodiments, the hydrophilic treated surface may include an upper and a lower surface of the first seal.

In example embodiments, the hydrophilic treated surface may be formed by an oxygen plasma treatment.

According to another aspect of example embodiments, an organic light emitting display apparatus includes a first substrate, an organic light display element, a second substrate and a sealing complex. The first substrate includes a display region and at least one peripheral region. The at least one peripheral display region surrounds the display region. The organic light display element is disposed in the display region of the first substrate. The second substrate corresponds to the first substrate. The sealing complex includes a first seal, a second seal and a third seal. The first seal is disposed in the at least one peripheral region. The second seal surrounds the first seal. The second seal is spaced apart from the first seal. The third seal is disposed between the first seal and the second seal.

In example embodiments, the first seal may include an organic material.

In example embodiments, the second seal may include an inorganic material.

In example embodiments, the third seal may include a highpolymer.

According to another aspect of example embodiments, a method of manufacturing an organic light emitting display apparatus is provided as follows. An organic light emitting element is formed in a display region of a first substrate. The first substrate has the display region and at least one peripheral region. The at least one peripheral region surrounds the display region. A first seal is formed in the at least one peripheral region of the first substrate. A second seal is formed in the at least one peripheral region. The second seal is spaced apart from the first seal. The at least one peripheral region is treated hydrophobically. A lower surface of a second substrate is treated hydrophobically. The hydrophobically treated first substrate is combined with the hydrophobically treated second substrate using the first seal and the second seal.

According to another aspect of example embodiments, a method of manufacturing an organic light emitting display apparatus is provided as follows. An organic light emitting element in is formed in a display region of a first substrate. The first substrate has the display region and at least one peripheral region. The at least one peripheral region surrounds the display region. The at least one peripheral region is treated hydrophilically. A first seal is formed in the at least one peripheral region. A second seal is formed in the at least one peripheral region. The second seal is spaced apart from the first seal. The at least one peripheral region of the first substrate is treated hydrophobically. A lower surface of a second substrate is treated hydrophilically. The hydrophobically treated first substrate is combined with the hydrophillically treated second substrate using the first seal and the second seal.

According to the organic light emitting display apparatus and the method of manufacturing the organic light emitting display apparatus, the organic light emitting display apparatus includes the sealing complex so that pollution caused by the contact of the first and second seals may be prevented.

BRIEF DESCRIPTION OF THE DRAWINGS

Example embodiments can be understood in more detail from the following description taken in conjunction with the accompanying drawings, in which.

DETAILED DESCRIPTION OF CERTAIN INVENTIVE EMBODIMENTS

Figure 1:
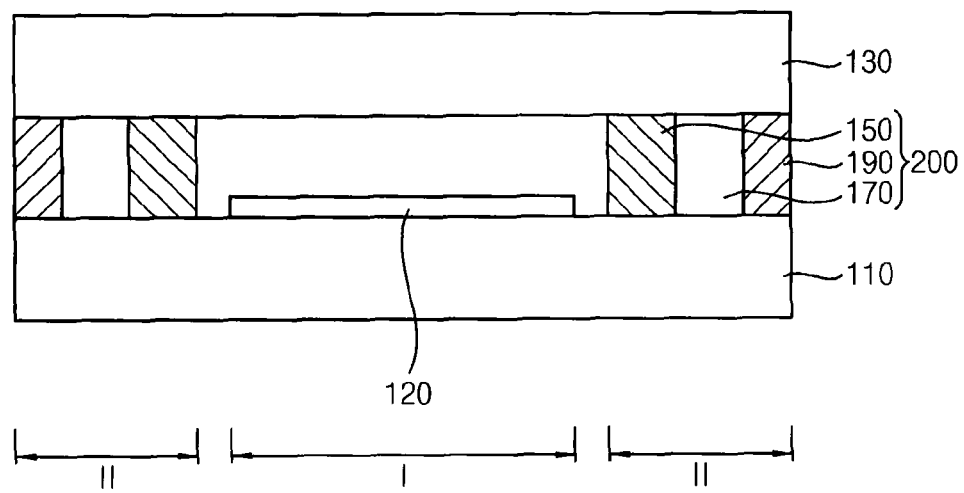
FIG. 1 is a cross-sectional view illustrating an organic light emitting display apparatus in accordance with one example embodiment of the present invention.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals generally refer to like or similar elements throughout. As used herein, the term "and/or" includes any and all combinations of one or more of the associated listed items.

It will be understood that, although the terms first, second, third, etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an organic light emitting display apparatus in accordance with one example embodiment of the present invention.

Referring to FIG. 1, the organic light emitting display apparatus 100 includes a first substrate 110, an organic light emitting element 120, a second substrate 130 and a sealing complex 200.

The first substrate 110 may include a transparent insulating substrate. For example, the first substrate 110 may include a glass substrate, a quartz substrate, a polymer resin substrate, or the like. In one embodiment, the first substrate 110 may include a low temperature poly-silicon (LTPS) glass.

The second substrate 130 is disposed by corresponding to the first substrate 110. The second substrate 130 may include a transparent insulating material. The second substrate 130 may include a glass substrate, a quartz substrate, a polymer resin substrate, or the like. In one embodiment, the second substrate 130 may include an encapsulation glass.

Referring again to FIG. 1, the first substrate 110 may include a display region I and one or more peripheral regions II.

The organic light emitting element 120 is disposed in the display region I of the first substrate 110. The organic light emitting element 120 generates a light using a driving signal from a driving circuit (not shown). An image is provided by generating the light in the organic light emitting element 120 in the display region I of the organic light emitting display apparatus 100.

The display region I is disposed in the center of the first substrate 110 and the peripheral regions II are disposed in both side portions of the first substrate 110 and may surround the display region I.

The sealing complex 200 is disposed in the peripheral region II of the first substrate 110 and is combined with the second substrate 130. The organic light emitting element 120 is physically isolated from the external environment by the sealing complex 200 and the second substrate 130. For example, the second substrate 130 is sealed with the first substrate 110 through the sealing complex 200. Accordingly, the organic light emitting element 120, which is disposed in the first substrate 110, may be protected from external water, air, and other contaminants.

In one embodiment, the sealing complex 200 may include a first seal 150, a second seal 190 and a hydrophobic treated surface 170. In this case, the first substrate 110 and the second substrate 130 are bonded by the first seal 150 and the second seal 190.

The first seal 150 of the sealing complex 200 is disposed in the peripheral region II of the first substrate 110 and may surround the display region I. For example, the first seal 150 is disposed along the boundary of the display region I and the peripheral region II. In one embodiment, the first seal 150 may include an organic material and is disposed in the inside of the peripheral region II. For example, the first seal 150 may include a sealant.

As the first seal 150 combines with the second substrate 130, the organic light emitting element 120 of the first substrate 110 is physically isolated from the external environment. In addition, an adhesiveness of the first substrate 110 and the second substrate 130 is improved. In one embodiment, the first seal 150 may include an organic material having elasticity such as polymide, which is a highpolymer compound. Accordingly, it may prevent separation of the sealing complex 200 from the first substrate 110 or the second substrate 130 in response to an external impact.

In another embodiment, the first seal 150 may further include an ultraviolet (UV) curable material. For example, the first seal 150 may include a compound such as the organic material and the ultraviolet curable material and may be hardened by irradiating an ultraviolet, a laser beam, visible ray, or the like. For example, the ultraviolet curable material may include epoxy Acrylate, polyester Acrylate, urethane Acrylate, polybutadine Acrylate, silicon Acrylate, alkyl Acrylate, and the like.

The second seal 190 of the sealing complex 200 is disposed in the peripheral region II of the first substrate 110, and surrounds the display region I. For example, the second seal 190 is disposed along an outside of the first seal 150. In one embodiment, the first seal 150 is spaced apart from the second seal 190.

In one embodiment, the second seal 190 includes an inorganic material. For example, the second seal 190 may include a frit and may be disposed in the outside of the peripheral region II.

In another embodiment, the second seal 190 may further include an ultraviolet (UV) curable material. For example, the second seal 190 may include a compound such as the organic material and the ultraviolet curable material and may be hardened by irradiating an ultraviolet, a laser beam, visible ray, or the like. For example, the ultraviolet curable material may include epoxy Acrylate, polyester Acrylate, urethane Acrylate, polybutadine Acrylate, silicon Acrylate, alkyl Acrylate, and the like.

As the second seal 190 combines with the second substrate 130, the organic light emitting element 120 of the first substrate 110 is physically isolated from the external environment. In addition, the first substrate 110 and the second substrate 130 can be bonded.

The hydrophobic treated surface 170 is a hydrophobic treated region. In one embodiment, a low temperature plasma treatment may be performed by using a gas of fluorocarbon (CF4), or the like between the first seal 150 and the second seal 190. For example, the hydrophobic treated region may include in the peripheral region II, a surface of corresponding to the first seal 150 and second seal 190, an upper surface of the first seal 150, the second seal 190 and the first substrate 110. As hydrophobic treated surface 170 is processed by the hydrophobic treatment, the first seal 150 and the second seal 190 are not contacted.

FIGS. 2A to 2F are cross-sectional views illustrating a method of manufacturing the organic light emitting display apparatus of FIG. 1.

Figure 2A:
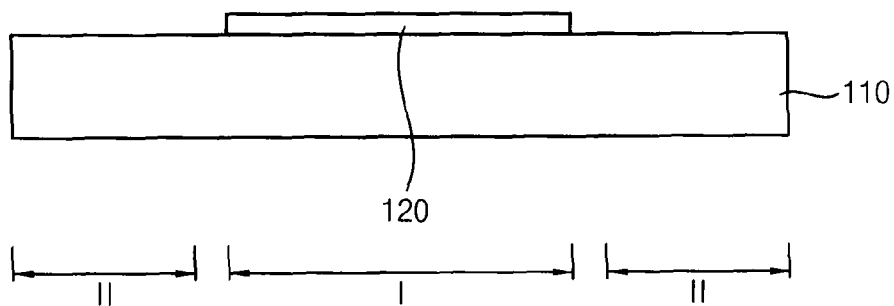
FIGS. 2A to 2F are cross-sectional views illustrating a method of manufacturing the organic light emitting display apparatus of FIG. 1.

Referring to FIG. 2A, an organic light emitting element 120 is formed in a display region I of a first substrate 110.

Figure 2B:
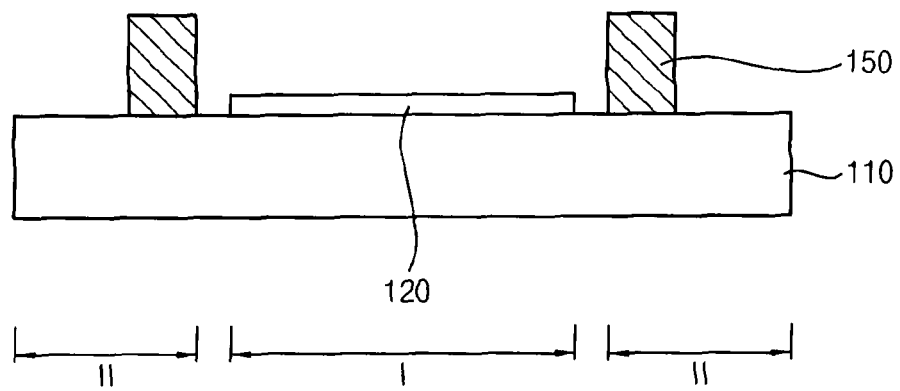

Referring to FIG. 2B, a first seal 150 is formed on the inside of a peripheral region II of the first substrate 110 forming the organic light emitting element 120.

Figure 2C:
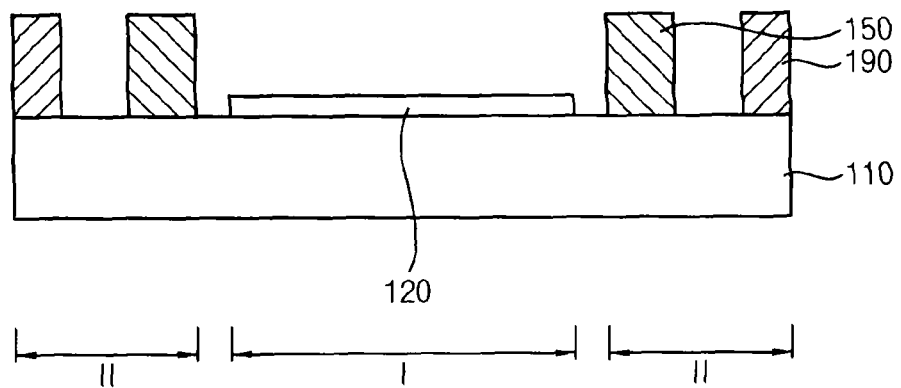

Referring to FIG. 2C, a second seal 190 is formed on the outside of the peripheral region II of the first substrate 110 forming the organic light emitting element 120 and the first seal 150.

Figure 2D:
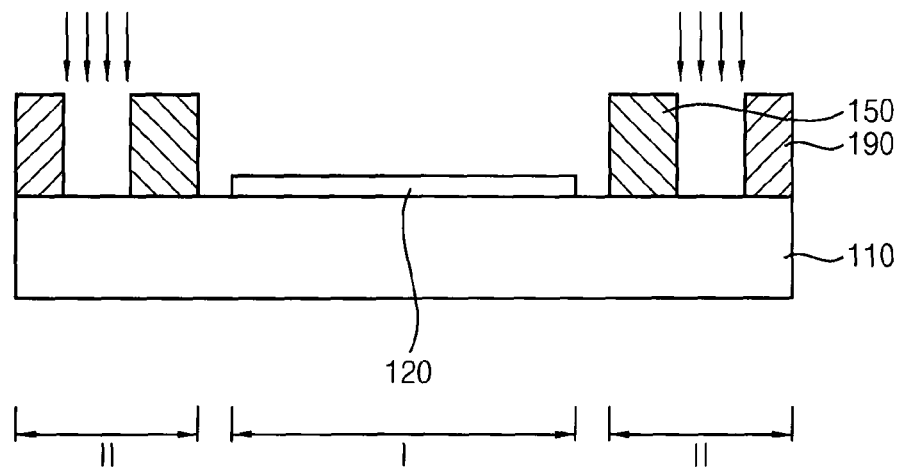

Referring to FIG. 2D, hydrophobic treated surface 170 forming between the first seal 150 and a second seal 190 is performed by a hydrophobic treatment. For example, a low temperature plasma treatment may be performed by using a gas of fluorocarbon (CF4) between the first seal 150 and the second seal 190. In one embodiment, the hydrophobic treatment may include in the peripheral region II, a surface of corresponding to the first seal 150 and second seal 190, an upper surface of the first seal 150, the second seal 190 and the first substrate 110.

Figure 2E:
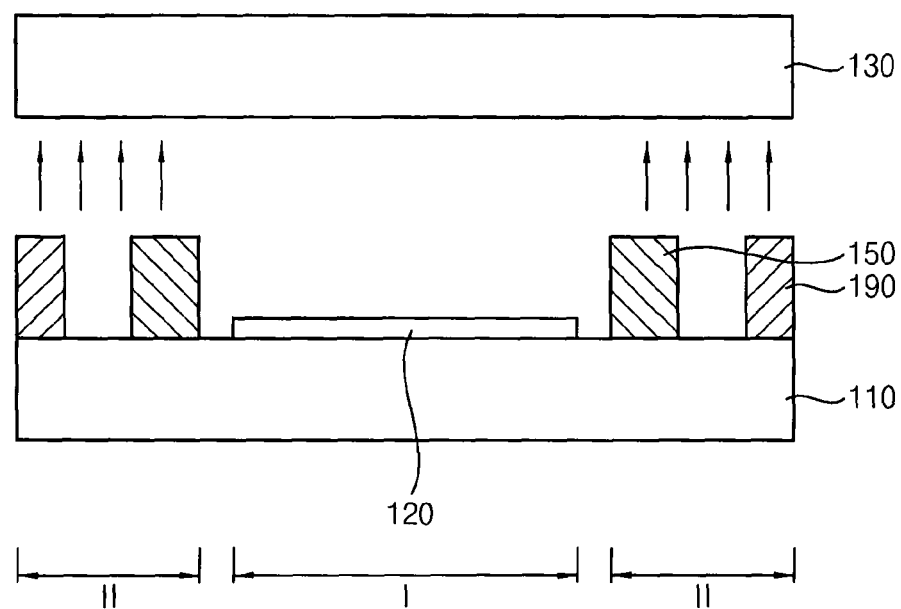

Referring to FIG. 2E, the peripheral region II of the second substrate 130 is processed by the hydrophobic treatment.

Figure 2F:
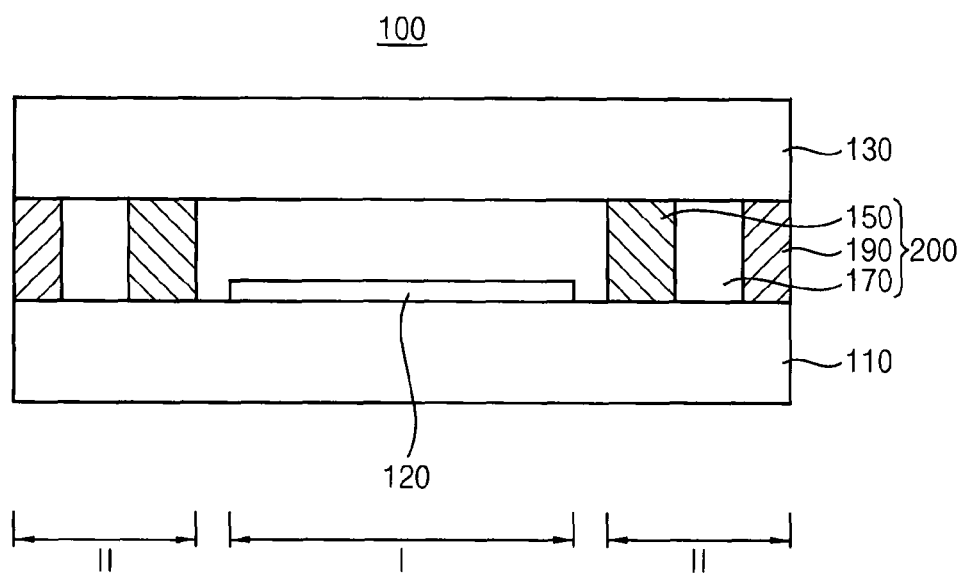

Referring to FIG. 2F, after completing the hydrophobic treatment, the first substrate 110 is combined with a sealing complex 200. For example, the second substrate 130 may compress into the first substrate 110.

In another example embodiment, the sealing complex 200 is formed on the second substrate 130 and may be combined with the first substrate 110. In the manufacturing process of the organic light emitting display apparatus 100 of such embodiments, the sealing complex 200 is formed on the second substrate 130.

Accordingly, as the organic light emitting display apparatus 100 has the hydrophobic treated region, the first seal 150 and the second seal 190 are not contacted. Before the sealing compression process, the organic light emitting display apparatus 100 may prevent pollution from the outer environment contacting the first seal 150 and the second seal 190.

Figure 3:
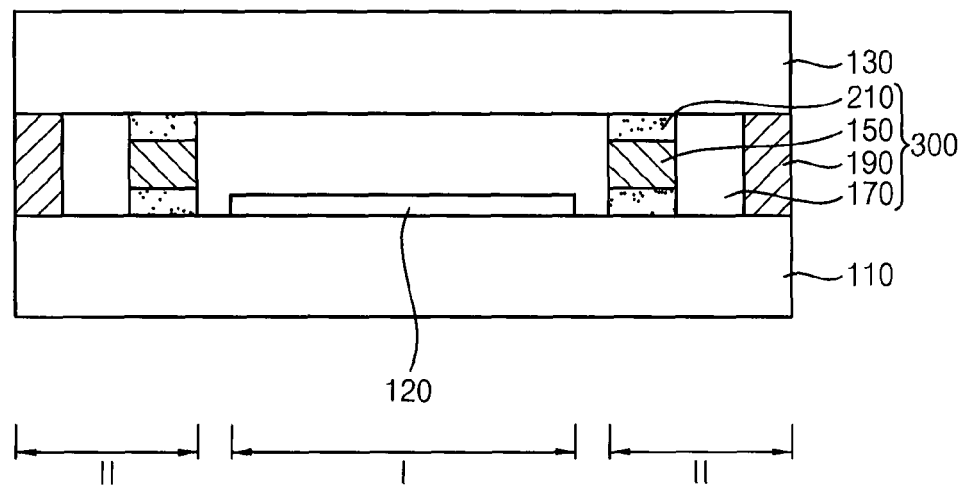
FIG. 3 is a cross-sectional view illustrating an organic light emitting display apparatus in accordance with another example embodiment of the present invention.

FIG. 3 is a cross-sectional view illustrating an organic light emitting display apparatus in accordance with another example embodiment of the present invention.

Referring to FIG. 3, the organic light emitting display apparatus 100 includes a first substrate 110, an organic light emitting element 120, a second substrate 130 and a sealing complex 300.

The first substrate 110 may include a transparent insulating substrate. For example, the first substrate 110 may include a glass substrate, a quartz substrate, a polymer resin substrate, or the like. In one embodiment, the first substrate 110 may include a low temperature poly-silicon (LTPS) glass.

The second substrate 130 is disposed by corresponding to the first substrate 110. The second substrate 130 may include a transparent insulating material. The second substrate 130 may include a glass substrate, a quartz substrate, a polymer resin substrate, or the like. In one embodiment, the second substrate 130 may include an encapsulation glass.

Referring again to FIG. 3, the first substrate 110 may include a display region I and a peripheral region II.

The organic light emitting element 120 is disposed in the display region I of the first substrate 110. The organic light emitting element 120 generates a light using a driving signal from a driving circuit (not shown). An image is provided by generating the light in the organic light emitting element 120 in the display region I of the organic light emitting display apparatus 100.

The display region I is disposed in the center of the first substrate 110 and the peripheral region II is disposed in both side portions of the first substrate 110 and may surround the display region I.

The sealing complex 300 is disposed in the peripheral region II of the first substrate 110 and is combined with the second substrate 130. The organic light emitting element 120 is physically isolated from the external environment by the sealing complex 300 and the second substrate 130. For example, the second substrate 130 is sealed with the first substrate 110 through the sealing complex 300. Accordingly, the organic light emitting element 120, which is disposed in the first substrate 110, may be protected from external water, air, and other pollutants on the external environment.

In one embodiment, the sealing complex 300 may include a first seal 150, a second seal 190, a hydrophobic treated surface 170 and a hydrophilic treated surface 210. In this case, the first substrate 110 and the second substrate 130 are bonded by the first seal 150 and the second seal 190.

The first seal 150 of the sealing complex 300 is disposed in the peripheral region II of the first substrate 110 and may surround the display region I. For example, the first seal 150 is disposed along the boundary of the display region I and the peripheral region II. In one embodiment, the first seal 150 may include an organic material and may be disposed in the inside of the peripheral region II. For example, the first seal 150 may include a sealant.

As the first seal 150 combines with the second substrate 130, the organic light emitting element 120 of the first substrate 110 is physically isolated from the external environment. In addition, an adhesiveness of the first substrate 110 and the second substrate 130 is improved. In one embodiment, the first seal 150 may include an organic material having elasticity such as polymide, which is a highpolymer compound. Accordingly, it may prevent the sealing complex 200 and the first substrate 110 or second substrate 130 from being separated by external impact.

In another example embodiment, the first seal 150 may further include an ultraviolet (UV) curable material. For example, the first seal 150 may include a compound such as the organic material and the ultraviolet curable material and may be hardened by irradiating an ultraviolet, a laser beam, visible ray, or the like. For example, the ultraviolet curable material may include epoxy Acrylate, polyester Acrylate, urethane Acrylate, polybutadine Acrylate, silicon Acrylate, alkyl Acrylate, and the like.

The second seal 190 of the sealing complex 300 is disposed in the peripheral region II of the first substrate 110, and surrounds the display region I. For example, the second seal 190 is disposed along an outside of the first seal 150. In one embodiment, the first seal 150 is spaced apart from the second seal 190.

In one embodiment, the second seal 190 includes an inorganic material. For example, the second seal 190 may include a frit and may be disposed in the outside of the peripheral region II.

In another example embodiment, the second seal 190 may further include an ultraviolet (UV) curable material. For example, the second seal 190 may include a compound such as the organic material and the ultraviolet curable material and may be hardened by irradiating an ultraviolet, a laser beam, visible ray, or the like. For example, the ultraviolet curable material may include epoxy Acrylate, polyester Acrylate, urethane Acrylate, polybutadine Acrylate, silicon Acrylate, alkyl Acrylate, and the like.

As the second seal 190 combines with the second substrate 130, the organic light emitting element 120 of the first substrate 110 is physically isolated from the external environment. In addition, the first substrate 110 and the second substrate 130 can be bonded.

The hydrophobic treated surface 170 is a hydrophobic treated region. In one embodiment, a low temperature plasma treatment may be performed by using a gas of fluorocarbon (CF4), or the like between the first seal 150 and the second seal 190. For example, the hydrophobic treated region may include in the peripheral region II, a surface of corresponding to the first seal 150 and second seal 190, an upper surface of the first seal 150, the second seal 190 and the first substrate 110. As hydrophobic treated surface 170 is processed by a hydrophobic treatment, the first seal 150 and the second seal 190 are not contacted.

The hydrophilic treated surface 210 is a hydrophilic treated region. In one embodiment, an oxygen plasma treatment may be performed between an upper surface of the first seal 150 and the first substrate 110, and between a lower surface of the first seal 150 and the second substrate 130. For example, the hydrophilic treated region may include a contact surface of the upper surface of the first seal 150 and the first substrate 110, and a contact surface of the lower surface of the first seal 150 and the second substrate 130. As hydrophilic treated surface 210 is processed by the hydrophobic treatment, an adhesiveness of the first substrate 110 and the second substrate 130 may be improved and a shock by a vibration of the first substrate 110 and the second substrate 130 may be absorbed. In addition, as the hydrophilic treated surface 210 prevents moisture and oxygen from entering into the organic light emitting element 120, problems such as reduction of lifetime of the organic light emitting element 120 by pollution, reduction of efficiency of luminescence and change of color of luminescence, among others, may be prevented.

FIGS. 4A to 4G are cross-sectional views illustrating a method of manufacturing the organic light emitting display apparatus of FIG. 3.

Figure 4A:
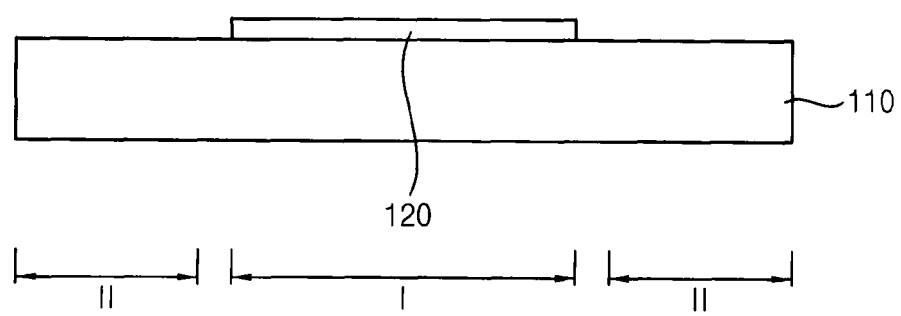
FIGS. 4A to 4G are cross-sectional views illustrating a method of manufacturing the organic light emitting display apparatus of FIG. 3.

Referring to FIG. 4A, an organic light emitting element 120 is formed in a display region I of a first substrate 110.

Figure 4B:
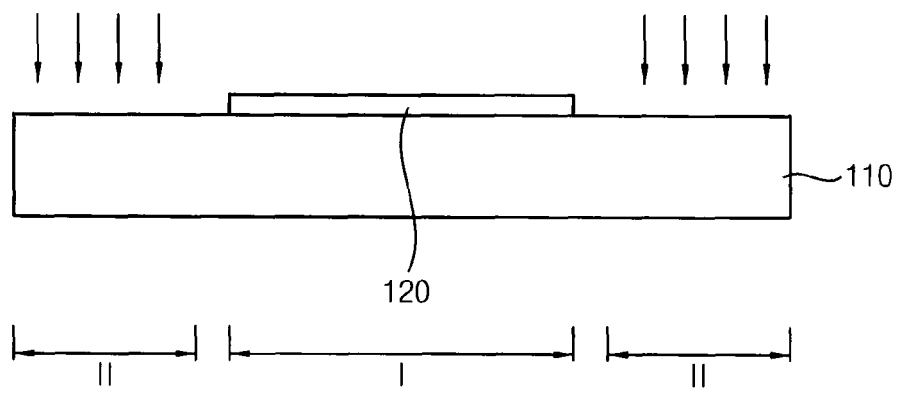
Figure 4C:
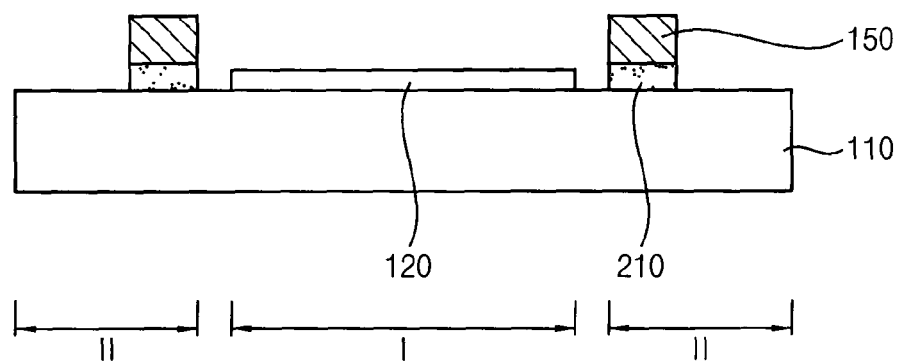

Referring to FIG. 4B, a peripheral region II of the first substrate 110 is processed by using hydrophilic treatment. For example, an oxygen plasma treatment may be performed Referring to FIG. 4C, a first seal 150 is formed on the inside surface of a peripheral region II of the first substrate 110 forming the organic light emitting element 120.

Figure 4D:
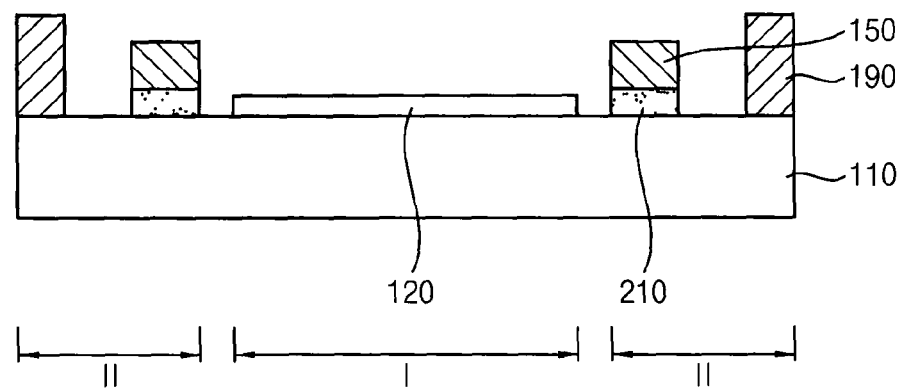

Referring to FIG. 4D, a second seal 190 is formed on the outside of the peripheral region II of the first substrate 110 forming the organic light emitting element 120 and the first seal 150.

Figure 4E:
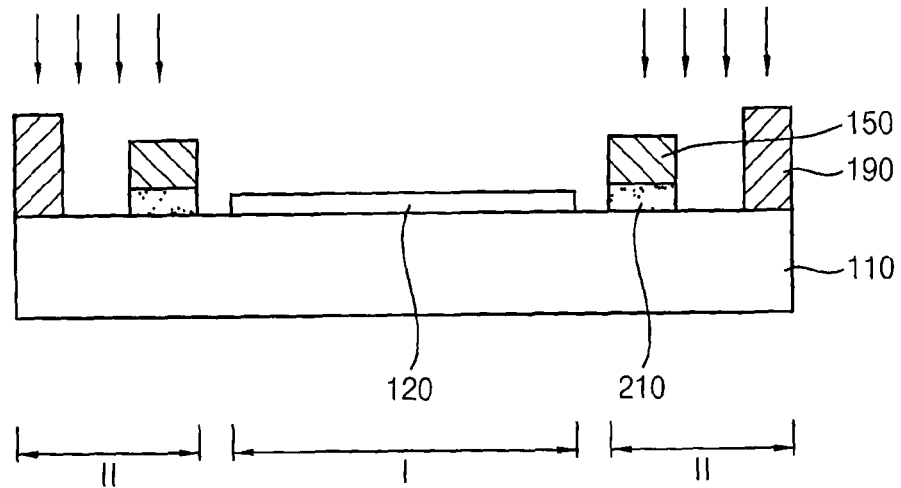

Referring to FIG. 4E, hydrophobic treated surface 170 formed between the first seal 150 and the second seal 190 is processed by a hydrophobic treatment. For example, a low temperature plasma treatment may be performed by using a gas of fluorocarbon (CF4) between the first seal 150 and the second seal 190. In one embodiment, the hydrophobic treatment may include in the peripheral region II, a surface corresponding to the first seal 150 and second seal 190, an upper surface of the first seal 150, the second seal 190 and the first substrate 110.

Figure 4F:
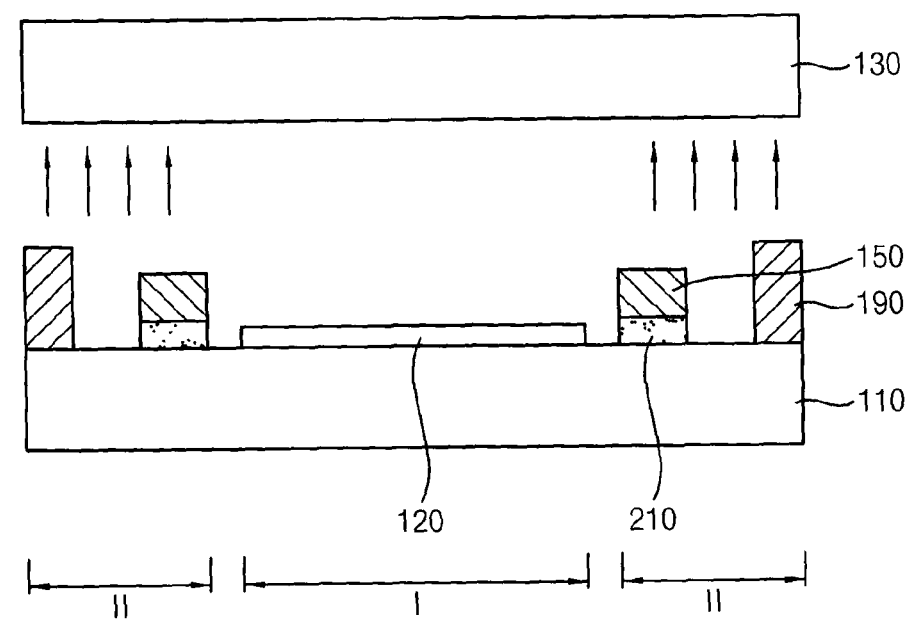

Referring to FIG. 4F, the peripheral region II of the second substrate 130 is processed by the hydrophilic treatment.

Figure 4G:
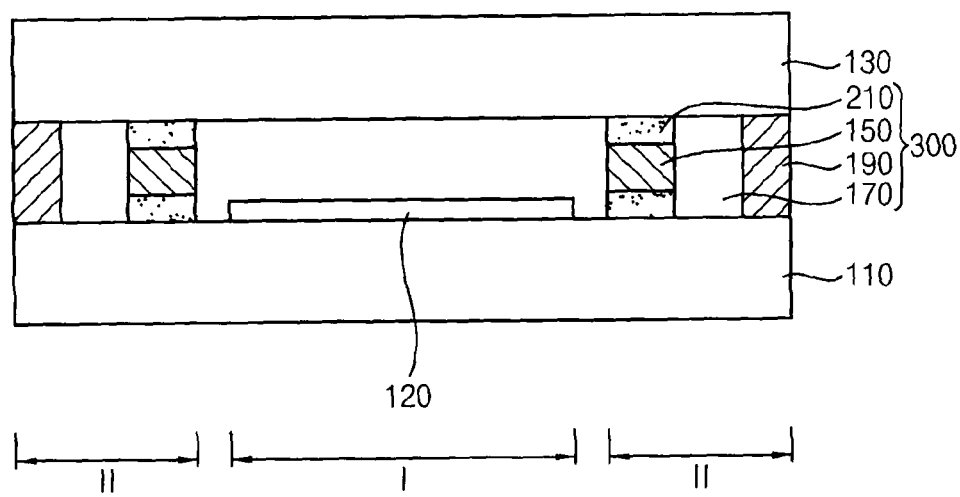

Referring to FIG. 4G, after completing the hydrophobic treatment, the first substrate 110 is combined with a sealing complex 300. For example, the second substrate 130 may compress into the first substrate 110. In one embodiment, a surface of the second substrate 130 cannot be processed by the hydrophobic treatment. In another example embodiment, the method may further include a step of the hydrophobic treatment in the lower surface of the second substrate 130.

In another example embodiment, the sealing complex 300 is formed on the second substrate 130 and is combined with the first substrate 110. In the manufacturing process of the organic light emitting element 120, the sealing complex 300 is formed on the second substrate 130.

Accordingly, as the organic light emitting display apparatus 100 has the hydrophobic treated region and the hydrophilic treated region, the first seal 150 and the second seal 190 are not contacted. Such an may prevent external materials from entering into the display region I including the organic light emitting element 120. Thus, before a sealing compression process, the organic light emitting display apparatus 100 may prevent pollution from contacting the first seal 150 and the second seal 190.

Figure 5:
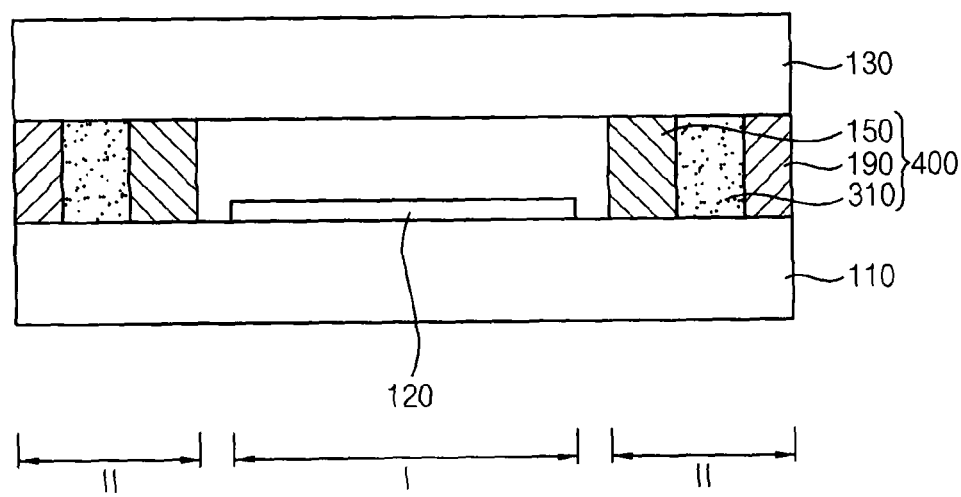
FIG. 5 is a cross-sectional view illustrating an organic light emitting display apparatus in accordance with still another example embodiment of the present invention.

FIG. 5 is a cross-sectional view illustrating an organic light emitting display apparatus in accordance with still another example embodiment of the present invention.

Referring to FIG. 5, the organic light emitting display apparatus 100 includes a first substrate 110, an organic light emitting element 120, a second substrate 130 and a sealing complex 400.

The first substrate 110 may include a transparent insulating substrate. For example, the first substrate 110 may include a glass substrate, a quartz substrate, a polymer resin substrate, or the like. In one embodiment, the first substrate 110 may include a low temperature poly-silicon (LTPS) glass.

The second substrate 130 is disposed by corresponding to the first substrate 110. The second substrate 130 may include a transparent insulating material. The second substrate 130 may include a glass substrate, a quartz substrate, a polymer resin substrate, or the like. In one embodiment, the second substrate 130 may include an encapsulation glass.

Referring again to FIG. 5, the first substrate 110 may include a display region I and a peripheral region II.

The organic light emitting element 120 is disposed in the display region I of the first substrate 110. The organic light emitting element 120 generates a light using a driving signal from a driving circuit (not shown). An image is provided by generating the light in the organic light emitting element 120 in the display region I of the organic light emitting display apparatus 100.

The display region I is disposed in the center of the first substrate 110, and the peripheral regions II are disposed in both side portions of the first substrate 110, and may surround the display region I.

The sealing complex 400 is disposed in the peripheral region II of the first substrate 110 and is combined with the second substrate 130. The organic light emitting element 120 is physically isolated from the external environment by the sealing complex 400 and the second substrate 130. For example, the second substrate 130 is sealed with the first substrate 110 through the sealing complex 400. Accordingly, the organic light emitting element 120, which is disposed in the first substrate 110, may be protected from external water, air, and other pollutants.

In one embodiment, the sealing complex 400 may include a first seal 150, a second seal 190 and a third seal 310. In this case, the first substrate 110 and the second substrate 130 are bonded by the first seal 150, the second seal 190 and the third seal 310.

The first seal 150 of the sealing complex 400 is disposed in the peripheral region II of the first substrate 110 and surrounds the display region I. For example, the first seal 150 is disposed along the boundary of the display region I and the peripheral region II. In one embodiment, the first seal 150 is spaced apart from the boundary of the display region I and the peripheral region II.

In one embodiment, the first seal 150 may include an organic material and may be disposed on the inside of the peripheral region II. For example, the first seal 150 may include a sealant.

As the first seal 150 combines with the second substrate 130, the organic light emitting element 120 of the first substrate 110 is physically isolated from the external environment. In addition, adhesiveness of the first substrate 110 and the second substrate 130 is improved. In one embodiment, the first seal 150 may include an organic material having elasticity such as polymide, which is a highpolymer compound. Accordingly, the sealing complex 400 and the first substrate 110 or second substrate 130 are prevented from being separated by external impact.

In another example embodiment, the first seal 150 may further include an ultraviolet (UV) curable material. For example, the first seal 150 may include a compound such as the organic material and the ultraviolet curable material and may be hardened by irradiating an ultraviolet, a laser beam, visible ray, or the like. For example, the ultraviolet curable material may include epoxy Acrylate, polyester Acrylate, urethane Acrylate, polybutadine Acrylate, silicon Acrylate, alkyl Acrylate, and the like.

The second seal 190 of the sealing complex 400 is disposed in the peripheral region II of the first substrate 110, and surrounds the display region I. For example, the second seal 190 is disposed along an outside of the first seal 150. In one embodiment, the first seal 150 is spaced apart from the second seal 190.

In one embodiment, the second seal 190 includes an inorganic material. For example, the second seal 190 may include a frit and may be disposed in the outside of the peripheral region II.

In another example embodiment, the second seal 190 may further include an ultraviolet (UV) curable material. For example, the second seal 190 includes a compound such as the organic material and the ultraviolet curable material and is hardened by irradiating an ultraviolet, a laser beam, visible ray, or the like. For example, the ultraviolet curable material may include epoxy Acrylate, polyester Acrylate, urethane Acrylate, polybutadine Acrylate, silicon Acrylate, alkyl Acrylate, and the like.

As the second seal 190 combines with the second substrate 130, the organic light emitting element 120 of the first substrate 110 is physically isolated from the external environment. In addition, the first substrate 110 and the second substrate 130 can be bonded.

The third seal 310 of the sealing complex 400 is disposed in the display region I and surrounds the display region I. For example, the third seal 310 is disposed between the first seal 150 and second seal 190. In one embodiment, the third seal 310 can be contacted with the first seal 150 and the second seal 190.

In one embodiment, the third seal 310 includes a high polymer. For example, third seal 310 may include a material such as carbon black having high absorption of a laser beam and disposed in center of the peripheral region II. As the third seal 310 is fused by irradiating a laser beam and is solidified, a shock by a vibration of the first substrate 110 and the second substrate 130 may be absorbed. Also, the third seal 310 provides that the first seal 150 and the second seal 190 are not contacted.

In another example embodiment, the third seal 310 may further include an ultraviolet (UV) curable material. For example, the third seal 310 may include a compound such as the organic material and the ultraviolet curable material and may be hardened by irradiating an ultraviolet, a laser beam, visible ray, or the like. For example, the ultraviolet curable material may include epoxy Acrylate, polyester Acrylate, urethane Acrylate, polybutadine Acrylate, silicon Acrylate, alkyl Acrylate, and the like.

As the third seal 310 combines with the second substrate 130, the organic light emitting element 120 of the first substrate 110 is physically isolated from the external environment. In addition, the first substrate 110 and the second substrate 130 can be bonded. In another example embodiment, the sealing complex 400 is formed on the second substrate 130 and may be combined with the first substrate 110. In the manufacturing process of the organic light emitting display apparatus 100, the sealing complex 400 is formed on the second substrate 130.

Accordingly, as the organic light emitting display apparatus 100 has the high polymer, the first seal 150 and the second seal 190 are not contacted. Also, a shock by a vibration of the first substrate 110 and the second substrate 130 may be absorbed. Thus, before a sealing compression process, the organic light emitting display apparatus 100 may prevent pollution by contacting the first seal 150 and the second seal 190.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. An organic light emitting display apparatus, comprising:
   a first substrate including a display region and at least one peripheral region, the at least one peripheral region surrounding the display region;
   an organic light emitting element disposed in the display region of the first substrate;
   a second substrate corresponding to the first substrate; and
   a sealing complex including a first seal and a second seal, the first seal disposed in the at least one peripheral region, the first seal surrounding the display region, the second seal being spaced apart from the first seal by a hydrophobic treated surface, the second seal surrounding the first seal.

2. The organic light emitting display apparatus of claim 1, wherein the hydrophobic treated surface comprises a surface between the first and second seals and an upper surface of the first substrate.

3. The organic light emitting display apparatus of claim 2, wherein the hydrophobic treated surface further comprises a lower surface of the second substrate.

4. The organic light emitting display apparatus of claim 1, wherein the first seal comprises an organic material.

5. The organic light emitting display apparatus of claim 1, wherein the second seal comprises an inorganic material.

6. The organic light emitting display apparatus of claim 1, wherein the hydrophobic treated surface is formed by a low temperature plasma treatment.

7. The organic light emitting display apparatus of claim 1, wherein the sealing complex further comprises a hydrophilic treated surface.

8. The organic light emitting display apparatus of claim 7, wherein the hydrophilic treated surface comprises an upper and a lower surface of the first seal.

9. The organic light emitting display apparatus of claim 8, wherein the hydrophilic treated surface is formed by an oxygen plasma treatment.

10. A method of manufacturing an organic light emitting display apparatus, the method comprising:
    forming an organic light emitting element in a display region of a first substrate, the first substrate having the display region and at least one peripheral region, the at least one peripheral region surrounding the display region;
    forming a first seal in the at least one peripheral region;
    forming a second seal in the at least one peripheral region, the second seal being spaced apart from the first seal;
    hydrophobically treating the at least one peripheral region of the first substrate;
    hydrophobically treating a lower surface of a second substrate; and
    combining the hydrophobically treated first substrate with the hydrophobically treated second substrate using the first seal and the second seal.

11. A method of manufacturing an organic light emitting display apparatus, the method comprising:
    forming an organic light emitting element in a display region of a first substrate, the first substrate having the display region and at least one peripheral region, the at least one peripheral region surrounding the display region;
    hydrophilically treating the at least one peripheral region;
    forming a first seal in the at least one peripheral region;

forming a second seal in the at least one peripheral region, the second seal being spaced apart from the first seal;
hydrophobically treating the at least one peripheral region;
hydrophilically treating a lower surface of a second substrate; and
combining the hydrophobically treated first substrate with the hydrophillically treated second substrate using the first seal and the second seal.

* * * * *